(12) United States Patent
Yee et al.

(10) Patent No.: US 7,514,666 B2
(45) Date of Patent: *Apr. 7, 2009

(54) COMPOSITE RECEIVER ASSEMBLY HAVING A CIRCUIT BOARD ON WHICH MULTIPLE RECEIVER DEVICES THAT OPERATE ON DIFFERENT SETS OF WAVELENGTHS ARE MOUNTED

(75) Inventors: Pak Hong Yee, Singapore (SG); Jing Zhang, Singapore (SG); Wee Sin Tan, Singapore (SG)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 11 days.

This patent is subject to a terminal disclaimer.

(21) Appl. No.: 11/552,026

(22) Filed: Oct. 23, 2006

(65) Prior Publication Data

US 2008/0011939 A1   Jan. 17, 2008

(30) Foreign Application Priority Data

Jul. 13, 2006   (SG) ............................ 200604730-2

(51) Int. Cl.
  G01J 1/44 (2006.01)
  H01J 40/14 (2006.01)
  H03F 3/08 (2006.01)
(52) U.S. Cl. ............................ 250/214 R; 250/214 AL; 250/214.1; 250/214 B; 250/205; 398/106; 398/164; 398/202; 257/431; 257/432; 257/433; 257/440; 257/678
(58) Field of Classification Search ............. 250/214 R, 250/214 AL, 214.1, 214 B, 205; 398/106, 398/164, 202; 257/431–433, 440, 678, 723, 257/787
See application file for complete search history.

(56) References Cited

U.S. PATENT DOCUMENTS

| 4,241,456 | A | * | 12/1980 | Nakagaki et al. ............ 398/106 |
| 4,977,619 | A | | 12/1990 | Crimmins |
| 5,151,628 | A | | 9/1992 | Osawa |
| 5,210,467 | A | | 5/1993 | Nagashima |
| 5,280,220 | A | | 1/1994 | Carter |
| 5,592,155 | A | * | 1/1997 | Ehrenmann ............ 340/825.72 |
| 5,973,811 | A | | 10/1999 | Madey |
| 5,977,882 | A | * | 11/1999 | Moore ................... 340/825.72 |
| 6,169,295 | B1 | * | 1/2001 | Koo ............................ 257/81 |
| 6,522,078 | B1 | | 2/2003 | Okamoto et al. |
| 6,954,563 | B2 | | 10/2005 | Kaplan |
| 7,247,940 | B2 | * | 7/2007 | Hofer et al. ................. 257/729 |
| 7,266,301 | B2 | * | 9/2007 | Stanchfield et al. ......... 398/126 |
| 2006/0013595 | A1 | | 1/2006 | Trezza et al. |
| 2006/0036831 | A1 | | 2/2006 | Karashima |
| 2007/0194212 | A1 | * | 8/2007 | Lin et al. .................. 250/214.1 |
| 2008/0011940 | A1 | * | 1/2008 | Zhang et al. .......... 250/214 AL |
| 2008/0013961 | A1 | * | 1/2008 | Yee et al. .................... 398/164 |

FOREIGN PATENT DOCUMENTS

WO   WO-03/036672   5/2003

* cited by examiner

Primary Examiner—Seung C Sohn

(57) ABSTRACT

Multiple devices that operate at different wavelengths of light are incorporated into a single composite assembly to reduce the amount of space that is needed to incorporate the assembly into a consumer electronics device. In addition, by implementing the devices in a single composite assembly, costs associated with manufacturing, assembly and shipping the assembly can be reduced. The composite assembly includes filtering mechanisms that prevent undesired wavelengths of light from impinging on the devices.

14 Claims, 4 Drawing Sheets

COMPOSITE RECEIVER ASSEMBLY HAVING A CIRCUIT BOARD ON WHICH MULTIPLE RECEIVER DEVICES THAT OPERATE ON DIFFERENT SETS OF WAVELENGTHS ARE MOUNTED

CROSS REFERENCE TO RELATED APPLICATIONS

This application claims priority to Singapore Patent Application No. 200604730-2, filed on Jul. 13, 2006, which is incorporated herein by reference in its entirety.

TECHNICAL FIELD OF THE INVENTION

The invention relates to optical devices and assemblies the incorporate optical devices.

BACKGROUND OF THE INVENTION

It is becoming increasingly common for consumer electronic devices to incorporate devices that use different wavelengths of light. Remote control (RC) receiver devices and ambient light photosensor (ALPS) devices are examples of devices that use different wavelengths of light and that are commonly incorporated into the same electronic device. RC receiver devices and ALPS devices are used in a wide variety of electronic devices such as television sets (TVs), digital video disc (DVD) players, personal computers (PCs), laptop computers, notebook PCs, and other types of devices.

RC receiver devices receive electromagnetic signals that are transmitted over an air interface from an RC transmitter device operated by a user. The electromagnetic signals are typically infrared (IR) signals. A photodiode of the RC receiver produces electrical signals in response to receiving the electromagnetic signals transmitted by the RC transmitter device. The electrical signals produced by the photodiode are converted into digital signals, which are then processed by the IC of the RC receiver device. The IC produces an output signal that is used by the electronic device in which the RC receiver device is employed (e.g., a laptop computer) to cause the electronic device to perform some function (e.g., run a particular application software program).

The RC receiver device is typically mounted on a circuit board and connections are made between conductors of the circuit board and the input/output (I/O) pads of the IC of the RC receiver device. The circuit board having the RC receiver device mounted on it is then installed in the electronic device and electrical connections are made between the I/O ports of the circuit board and devices or components of the electronic device.

ALPS devices are also employed in other systems, such as home lighting systems and wireless handheld devices such as personal digital assistants (PDAs) and mobile telephones. ALPS devices sense the level of ambient light in the surroundings and adjust brightness so that the lighting level is not too bright or too dark given the current level of ambient light in the surroundings. ALPS devices typically include an IC having an ambient light photosensor on it that senses the level of ambient light in the surroundings and produces an electrical signal that is converted into a digital signal for processing by the IC of the ALPS device. The IC produces an output signal that is used by the electronic device in which the ALPS device is employed to cause the electronic device to perform some function (e.g., adjust the brightness level of the TV screen or PC display monitor).

An ALPS device is typically mounted on a circuit board and connections are made between conductors of the circuit board and the I/O pads of the ALPS IC. The circuit board having the IC mounted on it is then installed in the electronic device and electrical connections are made between the I/O ports of the circuit board and components or device of the electronic device.

Electronic devices that employ both RC receiver devices and ALPS devices include one circuit board that has the RC receiver device mounted on it and another circuit board that has the ALPS device mounted on it. Each circuit board consumes a significant amount of space in the electronic device. Of course, a major goal in manufacturing many consumer electronic devices is to reduce their size. To achieve this goal, manufacturers are constantly searching for ways to efficiently use the available space. However, the number and types of functions that many electronic devices perform continue to increase, which makes it ever increasingly difficult to achieve overall size reduction. Using separate circuit boards for the RC receiver device and the ALPS device results in a relatively large amount of space in an electronic device being consumed, and also increases overall costs.

It would be desirable to provide a way to implement an RC receiver device and an ALPS device in a single composite assembly in order to conserve space in an electronic device that employs both devices. In addition, implementing an RC receiver device and an ALPS device in a single composite assembly should reduce costs associated with manufacturing, assembling and shipping the devices.

However, implementing both an RC receiver device and an ALPS device in a single composite assembly presents challenges. The photodiode of the RC receiver device is intended to receive IR light, but should be shielded from other wavelengths of light. Similarly, the photosensor of the ALPS device is intended to receive visible light from the surroundings, but should be shielded from other incident light of other wavelengths that may come from the surroundings.

Accordingly, a need exists for a suitable way to incorporate devices that use different wavelengths of light, such as an RC receiver device and an ALPS device, for example, into a single composite assembly.

SUMMARY OF THE INVENTION

The invention provides a composite assembly that comprises two or more devices that operate on light of different wavelengths, and a method for making the assembly. The composite assembly comprises a circuit board having a cup-shaped opening formed therein, a first receiver device that operates on a first set of wavelengths of light mounted on the circuit board inside of the cup-shaped opening, a second receiver device that operates on a second set of wavelengths of light mounted on the circuit board, a first filter device disposed at least partially inside of the cup-shaped opening, and a second filter device disposed the assembly. The first and second receiver devices have electrical connections that are connected to conductors of the circuit board. The first filter device passes light of the first set of wavelengths and filters out light of other wavelengths such that only light of the first set of wavelengths passes through the first filter device and impinges on the first device. The second filter device passes light of the second set of wavelengths and filters out light of other wavelengths such that only light of the second set of wavelengths passes through the second filter device and impinges on the second receiver device. The wavelengths of the first set of wavelengths are different from the wavelengths of the second set of wavelengths.

The method comprises forming a cup-shaped opening in a circuit board, attaching a first IC that operates on a first set of wavelengths of light to the circuit board inside of the cup-shaped opening, attaching a second IC that operates on a second set of wavelengths of light to the circuit board, performing a wire-bonding process to bond conductors of the first and second ICs to conductors of the circuit board, disposing a first filter device in the cup-shaped opening, disposing a second filter device to the assembly. The first filter device passes light of the first set of wavelengths and prevents light of other wavelengths from passing through the first filter device and impinging on the first IC. The second filter device passes light of the second set of wavelengths and prevents light of other wavelengths from passing through the second filter device and impinging on the second IC.

These and other features and advantages of the invention will become apparent from the following description, drawings and claims.

DETAILED DESCRIPTION OF AN EXEMPLARY EMBODIMENT

In accordance with the invention, an RC receiver device and an ALPS device are mounted on a single circuit board such that they are part of a single composite assembly. This reduces the amount of space that is needed in electronic devices that incorporate both RC receiver devices and ALPS devices. In addition, by implementing both devices in a single composite assembly, costs associated with manufacturing, assembly and shipping can be reduced. Because the RC receiver device and the ALPS device operate on light of different wavelengths, the composite assembly includes filtering mechanisms that prevent undesired wavelengths of light from impinging on the photodiode of the RC receiver device and on the photosensor of the ALPS device.

It should be noted, however, that the invention applies to devices other than RC receiver devices and ALPS devices. RC receiver devices and ALPS devices are merely examples of two types of devices that operate at different wavelengths of light and that would be advantageous to implement in a single composite assembly. Therefore, for exemplary purposes, the principles and concepts of the invention will be described with reference to incorporating an RC receiver device and an ALPS device into a single composite assembly. Those skilled in the art will understand the manner in which these principles may be applied to other types of devices that operate at different wavelengths of light. Also, the invention is not limited with respect to the number of such devices that may be incorporated into a single composite assembly.

Figure 1:
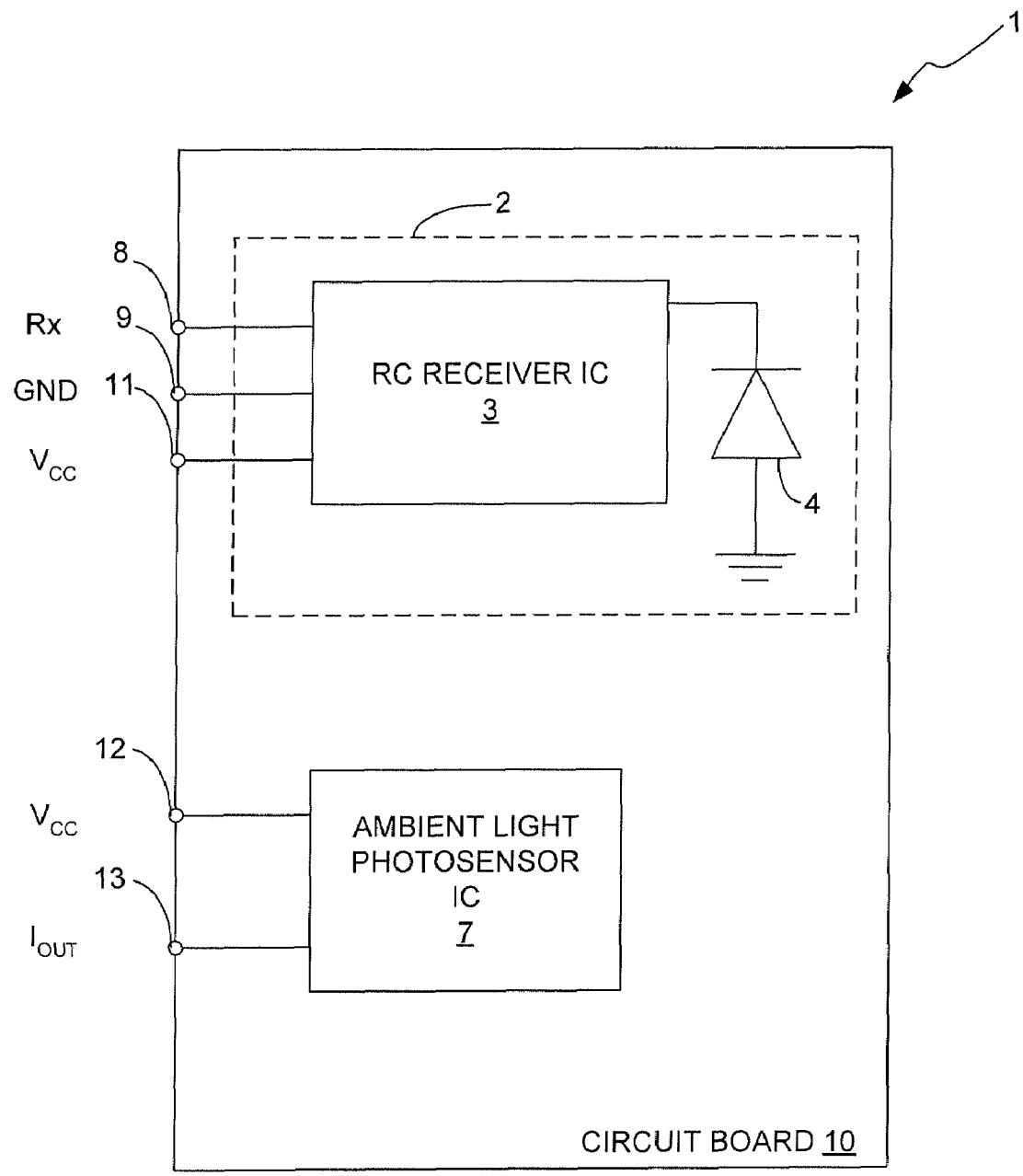
FIG. 1 illustrates a block diagram of the composite assembly of the invention in accordance with the exemplary embodiment, which includes an RC receiver device and an ALPS device mounted on and electrically connected to a circuit board.

FIG. 1 illustrates a block diagram of the composite assembly 1 of the invention in accordance with the exemplary embodiment, which includes an RC receiver device 2 and an ALPS device 6. The composite assembly 1 includes a circuit board 10, which is typically a printed circuit board (PCB). The RC receiver device 2 and the ALPS device 6 are mounted on the circuit board 10. The RC receiver device 2 includes an IC package 3 and an IR photodiode 4. The IR photodiode 4 is represented symbolically, but it is actually a separate IC. The ALPS device 7 comprises an IC, which includes an ambient light photosensor (not shown). The RC receiver device 2 and the ambient light sensor device 7 may be known devices that are currently available on the market.

The junctions labeled 8, 9 and 11-13 correspond to ports of the circuit board 10. The port 8 is an output port that receives the receiver signal, Rx, that is output at a pin (not shown) of the RC receiver IC 3 and sent over a conductive trace and wire bonds of the circuit board 10 to port 8 of the circuit board 10. The port 9 is an input port of the circuit board that is used to supply ground potential, GND, to a pin (not shown) of the RC receiver IC 3. The port 11 is an input port of the circuit board 10 that is used to supply the supply voltage, $V_{CC}$, to a pin (not shown) of the RC receiver IC 3. The port 12 of the circuit board 10 is an input port that is used to provide the supply voltage, $V_{CC}$, to a pin (not shown) of the IC of the ALPS device 7. The port 13 of the circuit board 10 is an output port that receives the ALPS signal, $I_{OUT}$, that is output at a pin (not shown) of the ALPS device IC 7.

The receiver signal Rx and the ALPS signal $I_{OUT}$ received at ports 8 and 13, respectively, of the circuit board 10 are provided to other devices or components (not shown) within the electronic device (not shown). These other devices or components use the signals in a known manner, e.g., to cause an application program to be executed by a processor, to cause the brightness of a display monitor to be adjusted, etc.

For purposes of describing an example of the manner in which the composite assembly of the invention may be implemented, the assembly is being described as having three separate ICs, namely, the RC receiver IC 3, the RC receiver photodiode IC 4 and the ALPS IC 7. This is because these devices are currently available on the market as three separate ICs. However, all of these devices may be integrated in the same IC or in two separate ICs. For example, the RC receiver IC 3 and the RC receiver photodiode IC 4 may be integrated into one IC and the ALPS device 7 may be implemented in a separate IC. Integrating more devices into the same IC or into two ICs enables the composite assembly to be further reduced in size and provides further cost savings.

The composite assembly 1 consumes much less space when installed in an electronic device than that which is consumed when an RC receiver device and an ALPS device are mounted on respective circuit boards and installed in an electronic device. Thus, the invention enables electronic devices to be made smaller in size and/or to include additional devices that provide additional functions to the electronic device. In addition, the manufacturing, assembly and shipping costs associated with the composite assembly are less than those associated with separate assemblies.

Figure 2:
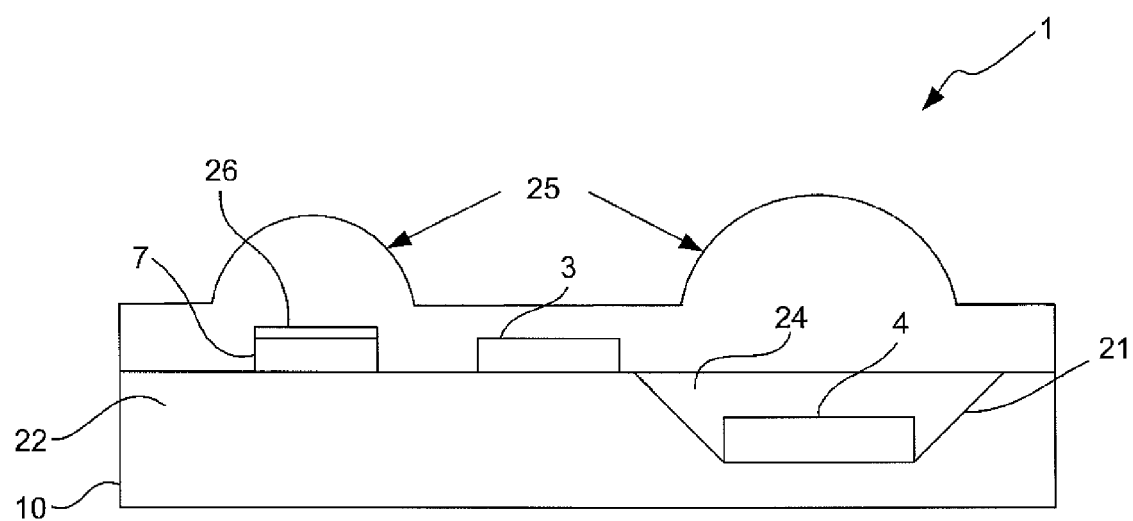
FIG. 2 illustrates a cross-sectional view of the composite assembly shown in FIG. 1.

The method of the invention for making the composite assembly 1 shown in FIG. 1 will now be described with reference to FIGS. 2 and 3. FIG. 2 illustrates a cross-sectional view of the composite assembly 1 shown in FIG. 1. The RC receiver IC 3, the RC receiver photodiode IC 4 and the ALPS IC 7 are attached to the circuit board 10 using a known die-attach process. However, prior to attaching the ICs 3, 4 and 7, a cup 21 is formed in the substrate 22 of the circuit board 10. After the ICs 3, 4 and 7 have been attached, a wire-bonding process is performed to make all of the electrical connections between the pins of the ICs and conductors (not shown) of the circuit board 10. The manner in which wire bonding is performed is well known.

After the ICs 3, 4 and 7 have been wire bonded to the conductors of the circuit board 10, an IR clear epoxy 24 is dispensed into the cup 21 to encapsulate the receiver photodiode IC die 4. The IR clear epoxy is then cured in an oven (not shown). The clear IR epoxy will allow IR light to penetrate through it and impinge on the RC photodiode IC die 4, but will filter out all other wavelengths of light. Preferably, the IR clear epoxy is a silicone-base epoxy that obviates any potential problems associated with thermal stress that may result due to Coefficient of Thermal Expansion (CTE) mismatching. A variety of IR epoxies available on the market are suitable for this purpose.

The upper surface of the assembly 1 is then covered with a transparent epoxy 25. The transparent epoxy 25 may be applied using, for example, a transfer molding process or a sheet cast molding process. The transparent epoxy 25 allows ambient light to pass through it, which includes IR light. However, the ALPS IC 7 has a visible-light coating 26 on its upper surface that filters out wavelengths of light other than visible light. Only the visible light will pass through the visible-light coating 26 and impinge on the ALPS IC 7. A variety of visible-light coatings are available in the market that are suitable for this purpose. The remainder of the process steps are the normal process steps used when assembling a circuit board today, and therefore will not be described.

Figure 3:
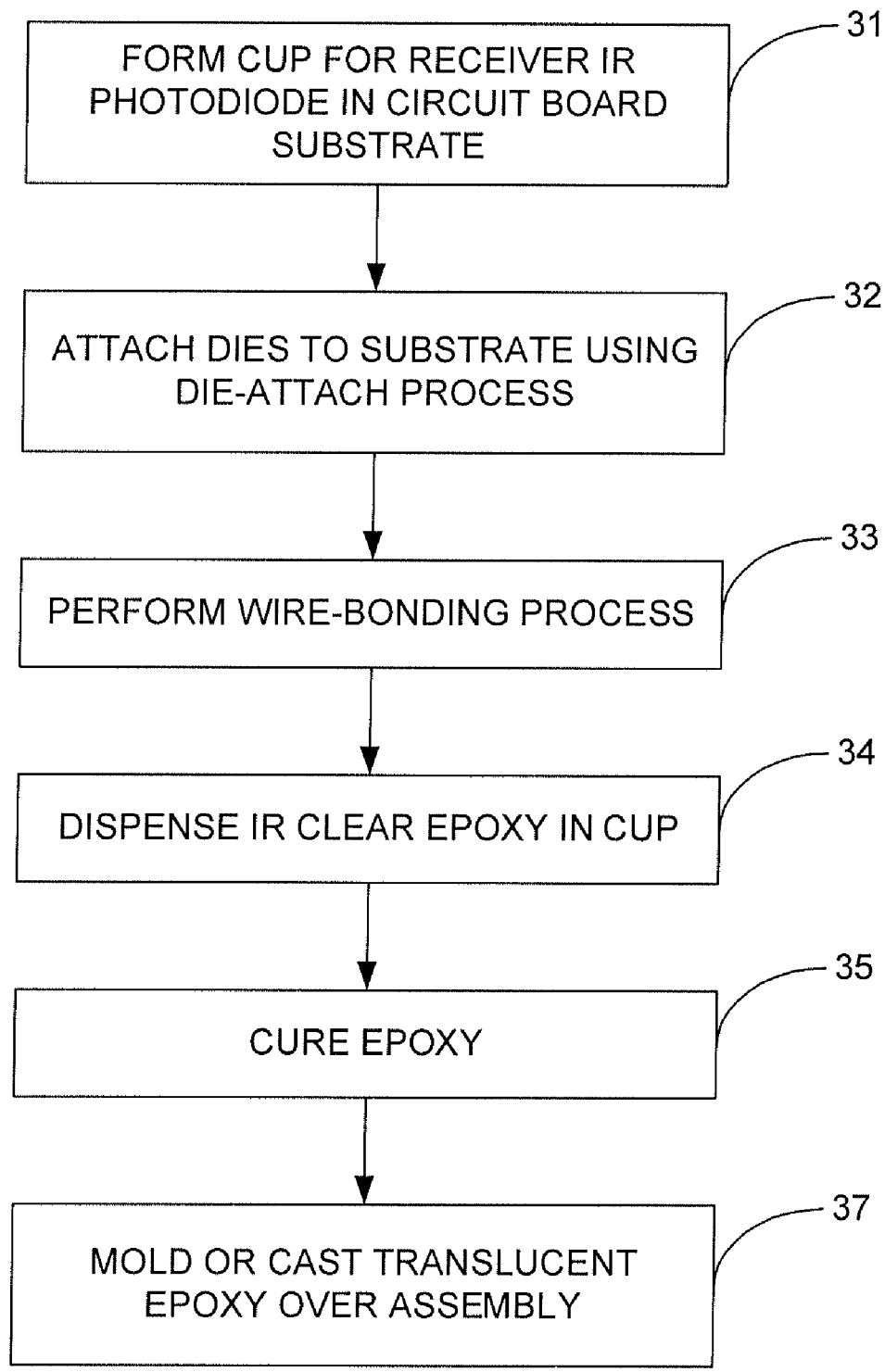
FIG. 3 illustrates a flowchart that represents the exemplary method described above with reference to FIG. 2.

FIG. 3 illustrates a flowchart that represents the exemplary method described above with reference to FIG. 2. A cup is formed in the substrate of the circuit board, as indicated by block 31. The ICs are attached using a die-attach process, as indicated by block 32. Intermediate process steps may be performed after forming the cup and before attaching the ICs. After the ICs have been attached, they are wire bonded to the conductors of the circuit board, as indicated by block 33. After wire bonding has been performed, IR clear epoxy is dispensed into the cup such that the epoxy encapsulates the receiver photodiode IC 4, as indicated by block 34. The epoxy is then cured, as indicated by block 35. The transparent epoxy 25 is then applied by using a molding or casting process, as indicated by block 37. As stated above, other known process steps are typically performed after the transparent epoxy has been molded or cast over the assembly.

The visible-light coating 26 is typically applied at the wafer level to the ALPS ICs, and therefore is not shown as being part of the process represented by the flowchart shown in FIG. 3. The invention is not limited with respect to when any of the steps are performed, except in cases where it is necessary for one or more steps to be performed before one or more other steps are performed.

Figure 4A:
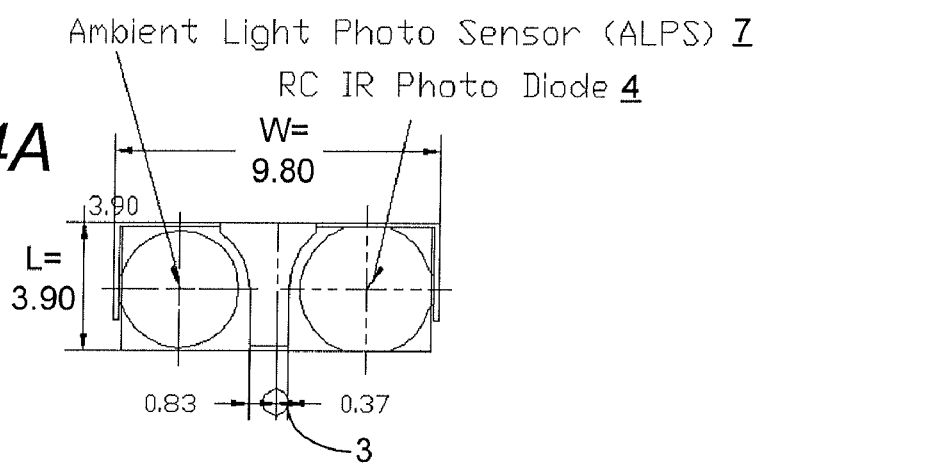
FIGS. 4A and 4B illustrate top and side views, respectively, of the composite assembly shown in FIG. 2.
Figure 4B:
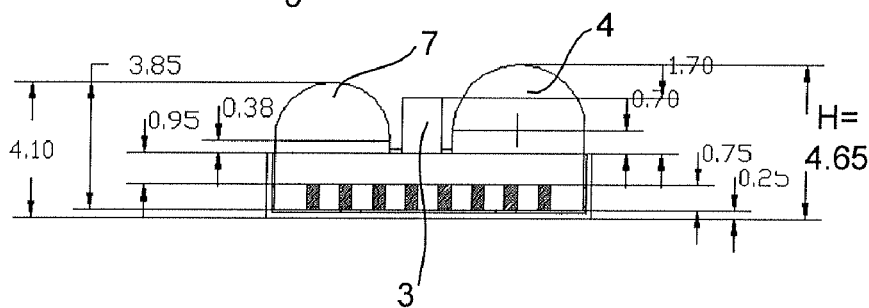

FIGS. 4A and 4B illustrate top and side views, respectively, of the composite assembly shown in FIG. 2. The invention is not limited to the dimensions shown in FIGS. 4A and 4B. The dimensions are shown to demonstrate the miniature nature of the assembly 1. The dimensions are given in units of millimeters (mm). In FIG. 4A, it can be seen that the overall width, W, of the assembly 1 is 9.80 mm. It can also be seen in FIG. 4A that the overall length, L, is 3.90 mm. It can be seen in FIG. 4B that the overall height, H, is 4.65 mm or less. Thus, the composite assembly 1 is extremely small in size and will consume only a very small amount of space in the electronic device in which it is employed.

The invention has been described with reference to exemplary embodiments for the purpose of demonstrating the principles and concepts of the invention. As will be understood by those skilled in the art, many modifications may be made to the embodiments described herein and all such modifications are within the scope of the invention.

What is claimed is:

1. A composite assembly comprising:
   a circuit board having a cup-shaped opening formed therein;
   a first receiver device mounted on the circuit board inside of the cup-shaped opening, the first receiver device operating on a first set of wavelengths of light, the first receiver device having electrical connections that are connected to conductors of the circuit board;
   a second receiver device mounted on the circuit board, the second receiver device operating on a second set of wavelengths of light, the second receiver device having electrical connections that are connected to conductors of the circuit board;
   a first filter device disposed at least partially inside of the cup-shaped opening, the first filter device passing light of the first set of wavelengths and filtering out light of other wavelengths such that only light of the first set of wavelengths passes through the first filter device and impinges on the first device; and
   a second filter device disposed on the assembly, the second filter device passing light of the second set of wavelengths and filtering out light of other wavelengths such that only light of the second set of wavelengths passes through the second filter device and impinges on the second device, and wherein the wavelengths of the first set of wavelengths are different from the wavelengths of the second set of wavelengths.

2. The composite assembly of claim 1, wherein the first receiver device includes an infrared (IR) photodiode integrated circuit (IC), the first set of wavelengths being IR wavelengths.

3. The composite assembly of claim 2, wherein the first filter device is an IR epoxy.

4. The composite assembly of claim 1, wherein said second receiver device includes an ambient light photosensor (ALPS) integrated circuit (IC), and wherein the second wavelengths of light are visible-light wavelengths, and wherein the second filter device is a visible-light pass filter located on the ALPS IC such that only visible light impinges on the ALPS IC.

5. The composite assembly of claim 4, further comprising a transparent epoxy covering said first and second receiver devices and said first and second filter devices.

6. The composite assembly of claim 4, wherein the composite assembly is less than approximately 10 millimeters (mm) in width, 4 mm in length and 5 mm in height.

7. A method for making a composite assembly that includes multiple devices that operate at different wavelengths, the method comprising:
   forming a cup-shaped opening in a circuit board;
   attaching a first IC to the circuit board inside of the cup-shaped opening, the first IC operating on a first set of wavelengths of light;
   attaching a second IC to the circuit board, the second IC operating on a second set of wavelengths of light;
   performing a wire-bonding process to bond conductors of the first and second ICs to conductors of the circuit board;
   disposing a first filter device in the cup-shaped opening, the first filter device passing light of the first set of wavelengths and preventing light of other wavelengths from passing through the first filter device and impinging on the first IC; and
   disposing a second filter device on the assembly, the second filter device passing light of the second set of wavelengths and preventing light of other wavelengths from passing through the second filter device and impinging on the second IC, wherein the wavelengths of the first set of wavelengths are different from the wavelengths of the second set of wavelengths.

8. The method of claim 7, wherein the first IC includes an infrared (IR) photodiode IC, the wavelengths of the first set of wavelengths being IR wavelengths.

9. The method of claim 8, wherein the first filter device is an IR epoxy, the method including the step of curing the IR epoxy after disposing the IR epoxy in the cup-shaped opening.

10. The method of claim 9, wherein the second IC is an ambient light photosensor (ALPS) IC of an ALPS device, and wherein said second filter device is a visible-light pass filter, and wherein the wavelengths of the second set of wavelengths are visible-light wavelengths, and wherein the visible-light pass filter is located on the assembly such that only visible light passes through the visible-light pass filter and impinges on the ALPS IC.

11. The method of claim 10, further comprising:
applying a transparent epoxy to the assembly that covers the first and second ICs and the first and second filter devices.

12. The method of claim 7, wherein the composite assembly is less than approximately 10 millimeters (mm) in width, 4 mm in length and 5 mm in height.

13. The method of claim 10, wherein the visible-light pass filter is a pre-coating material that is applied to the second IC prior to attaching the second IC to the circuit board.

14. The method of claim 13, wherein the first IC is an IR photodiode IC of a remote control (RC) receiver device.

* * * * *